US009640229B2

(12) United States Patent
Wang et al.

(10) Patent No.: US 9,640,229 B2
(45) Date of Patent: May 2, 2017

(54) MEMORY CIRCUIT AND LAYOUT STRUCTURE OF A MEMORY CIRCUIT

(71) Applicant: MediaTek Inc., Hsin-Chu (TW)

(72) Inventors: Dao-Ping Wang, Hsinchu (TW); Chia-Wei Wang, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/692,057

(22) Filed: Apr. 21, 2015

(65) Prior Publication Data

US 2016/0203847 A1 Jul. 14, 2016

Related U.S. Application Data

(60) Provisional application No. 62/102,204, filed on Jan. 12, 2015.

(51) Int. Cl.
| | |
|---|---|
| *G11C 5/06* | (2006.01) |
| *G11C 7/06* | (2006.01) |
| *G11C 7/00* | (2006.01) |
| *G11C 16/12* | (2006.01) |
| *G11C 17/12* | (2006.01) |
| *G11C 17/14* | (2006.01) |
| *G11C 11/56* | (2006.01) |
| *G11C 5/14* | (2006.01) |

(52) U.S. Cl.
CPC .............. *G11C 7/06* (2013.01); *G11C 5/06* (2013.01); *G11C 7/00* (2013.01); *G11C 11/5692* (2013.01); *G11C 16/12* (2013.01); *G11C 17/12* (2013.01); *G11C 17/14* (2013.01); *G11C 5/063* (2013.01); *G11C 5/14* (2013.01)

(58) Field of Classification Search
CPC .... G11C 7/06; G11C 7/00; G11C 5/06; G11C 16/12
USPC ................................................ 365/63, 185.01
See application file for complete search history.

(56) References Cited

U.S. PATENT DOCUMENTS

| | | | | |
|---|---|---|---|---|
| 5,917,224 A | * | 6/1999 | Zangara | H01L 27/112 257/208 |
| 6,636,434 B2 | * | 10/2003 | Poullet | G11C 11/5692 365/103 |
| 2011/0051487 A1 | * | 3/2011 | Nevers | G11C 5/02 365/51 |
| 2015/0310924 A1 | * | 10/2015 | Chen | G11C 17/16 365/96 |

* cited by examiner

*Primary Examiner* — Toan Le
(74) *Attorney, Agent, or Firm* — McClure, Qualey & Rodack, LLP

(57) ABSTRACT

A memory circuit includes a transistor, a signal line and a plurality of information lines. The transistor includes a first electrode, a second electrode and a control electrode. The transistor is included in a memory cell. The signal line is connected to the first electrode of the transistor. The voltage on the signal line is programmable. At most one of the information lines is connected to the second electrode of the transistor via a contact. Information stored in the memory cell is coded according to the voltage programmed on the signal line and an option of which information line the contact should connect to the second electrode of the transistor.

15 Claims, 6 Drawing Sheets

MEMORY CIRCUIT AND LAYOUT STRUCTURE OF A MEMORY CIRCUIT

CROSS REFERENCE TO RELATED APPLICATIONS

This application claims the benefit of U.S. Provisional Application No. 62/102,204 filed Jan. 12, 2015, the entirety of which is incorporated by reference herein.

BACKGROUND OF THE INVENTION

Field of the Invention

The invention relates to a memory circuit, and more particularly to a multi-bit information coded memory circuit.

Description of the Related Art

Today, various electronic products and applications require significant amounts of on-chip read-only memory (ROM).

Conventional ROM cells, cell arrays, and memory architectures suffer from a number of problems, including area inefficiency, high cost, and high power consumption.

There is a need therefore for improved ROM cells, cell arrays, and memory architectures.

BRIEF SUMMARY OF THE INVENTION

A memory circuit and the layout structure of a memory circuit are provided. An exemplary embodiment of a memory circuit comprises a transistor, a signal line and a plurality of information lines. The transistor comprises a first electrode, a second electrode and a control electrode. The transistor is comprised in a memory cell. The signal line is connected to the first electrode of the transistor. A voltage on the signal line is programmable. At most one of the information lines is connected to the second electrode of the transistor via a contact. Information stored in the memory cell is coded according to the voltage programmed on the signal line and an option of which information line to contact should connect to the second electrode of the transistor.

An exemplary embodiment of a memory circuit comprises a plurality of transistors, a signal line, a first set of information lines and a second set of information lines. The transistors comprise at least a first transistor and a second transistor. Each transistor is comprised in a memory cell and comprises a first electrode, a second electrode and a control electrode. The signal line is connected to the first electrode of the first transistor and the first electrode of the second transistor. A voltage on the signal line is programmable. At most one information line in the first set of information lines is connected to the second electrode of the first transistor via a first contact. At most one information line in the second set of information lines is connected to the second electrode of the second transistor via a second contact. Information stored in each memory cell is coded according to the voltage programmed on the signal line and an option of which information line in the corresponding set of information lines. The corresponding contact should connect to the second electrode of the corresponding transistor.

A layout structure of a memory circuit comprises a first active area, a first gate strip, a first metal strip, a plurality of second metal strips and a first contact. The first gate strip is disposed on the first active area and extended along a first direction. The first metal strip is disposed on the first active area and extended along the first direction. The plurality of second metal strips are extended along a second direction and comprise a first metal strip forming a signal line of the memory circuit and a plurality of second metal strips forming a first set of information lines of the memory circuit. The first contact connects the first second metal strip and the first metal strip. The first gate strip is disposed on the first active area to form a first transistor of the memory circuit, and the signal line and at most one information line in the first set of information lines is/are connected to different electrodes of the first transistor via different contacts to form a multi-bit information coded memory cell.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
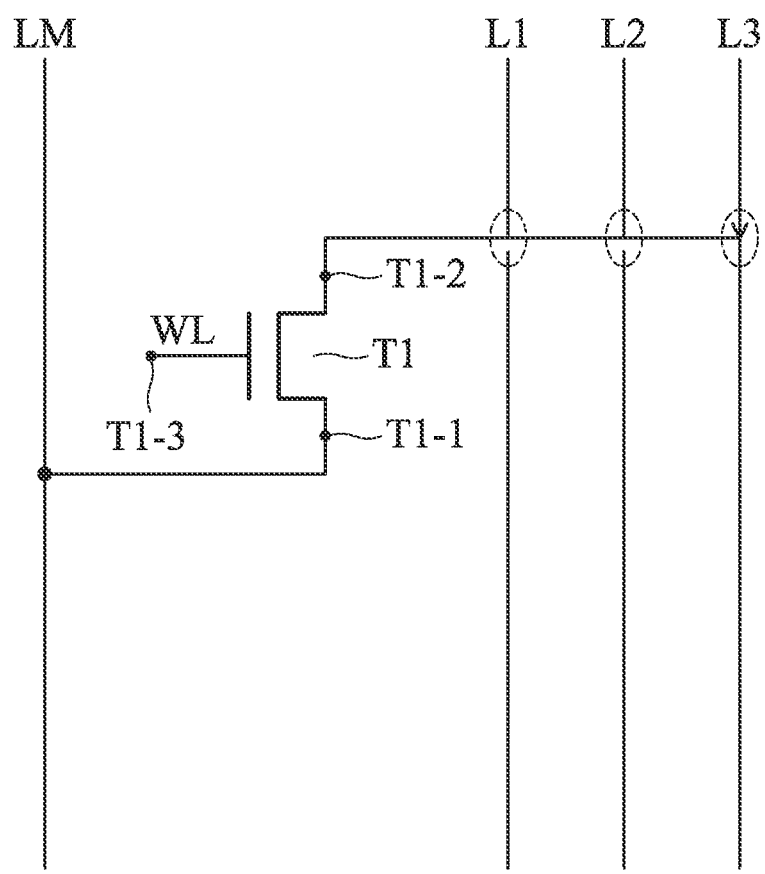
FIG. 1 shows an exemplary circuit diagram of a memory cell in a memory circuit according to an embodiment of the invention.

FIG. 1 shows an exemplary circuit diagram of a memory cell in a memory circuit according to an embodiment of the invention. According to an embodiment of the invention, the memory circuit 100 may at least comprise a transistor T1, a signal line LM and a plurality of information lines L1~L3. The transistor T1 is comprised in a memory cell and comprises a first electrode T1-1, a second electrode T1-2 and a control electrode T1-3. According to an embodiment of the invention, the control electrode T1-3 may be the gate electrode, the first electrode T1-1 may be the drain or source electrode, and the second electrode T1-2 may be the source or drain electrode of the transistor T1. Note that, in order to clarify the concept of the invention, FIG. 1 presents a simplified block diagram in which only some elements relevant to the invention are shown. As will be readily appreciated by those with ordinary skill in the art, the memory circuit 100 may further be extended to comprise more than one memory cell, more than one transistor, more than three information lines and/or more than one signal line, and thus the invention should not be limited thereto.

As shown in FIG. 1, a word line WL is connected to the control electrode T1-3 of the transistor T1 and the signal line LM is connected to the first electrode T1-1 of the transistor T1. According to an embodiment of the invention, a voltage on the signal line LM is programmable. Therefore, the voltage on the signal line LM is not fixed. In addition, according to an embodiment of the invention, none or at most one of the information lines is connected to the second electrode T1-2 of the transistor T1 via a corresponding contact. In the embodiments of the invention, the information line connected to the second electrode of a corresponding transistor can be flexibly designed depending on which information is to be stored in the corresponding memory cell. As shown in FIG. 1, only the information line L3 is connected to the second electrode T1-2 of the transistor T1 via a corresponding contact (not shown).

According to an embodiment of the invention, information stored in the memory cell is coded according to the voltage programmed on the signal line LM and an option of which information line the contact should connect to the second electrode T1-2 of the transistor T1. In this manner, multiple bits of information can be coded in the memory cell. In an embodiment of the invention, the voltage programmed on the signal line LM is controlled and provided by a voltage control circuit (such as the voltage control circuit 423 shown in FIG. 4). In addition, the memory circuit may further comprise a sense amplifier (such as the sense amplifier 431 shown in FIG. 4) coupled to the information lines and sensing voltages on the information lines to output multiple bits of information. Take the circuit diagram shown in FIG. 1 as an example, when there are three information lines configured in a set of information lines for encoding multiple bits of information in each memory cell, the sense amplifier can output two bits of information, such as the output bits Q[0] and Q[1] shown in the following tables, according to the sensed voltages.

Table 1 shows the exemplary output bits coded by different states of three information lines L1~L3 according to an embodiment of the invention.

TABLE 1 exemplary output bits coded by different states of three information lines L1~L3

| States of information lines L1~L3 | | | Output Bits | |
|---|---|---|---|---|
| L1 | L2 | L3 | Q[1] | Q[0] |
| H | L | L | 0 | 1 |
| L | H | L | 1 | 0 |
| L | L | H | 1 | 1 |
| L | L | L | 0 | 0 |

Suppose that, in the embodiment, the signal line LM and three information lines L1~L3 are initially charged to ground voltage GND. When reading the memory cell, the voltage on the signal line LM is programmed to a predetermined level, such as a level of the supply voltage VDD, and the transistor is turned on by activating the word line connected to the control electrode of the transistor, so as to charge the information line connected to the second electrode of the transistor. As the example shown in Table 1, when the information line L1 is connected to the second electrode T1-2 of the transistor T1 via the corresponding contact, the state of the information line L1 becomes high (H) when the voltage on the signal line LM is programmed to VDD and the transistor T1 is turned on by activating the word line WL, and the state of the remaining information lines not connected to the second electrode T1-2 of the transistor T1 remain low (L). Note that when none of the information lines L1~L3 is connected to the second electrode T1-2 of the transistor T1, the states of all the information lines L1~L3 remain low (L).

Table 2 shows the exemplary output bits coded by different states of three information lines L1~L3 according to another embodiment of the invention.

TABLE 2 exemplary output bits coded by different states of three information lines L1~L3

| States of information lines L1~L3 | | | Output Bits | |
|---|---|---|---|---|
| L1 | L2 | L3 | Q[1] | Q[0] |
| L | H | H | 0 | 1 |
| H | L | H | 1 | 0 |
| H | H | L | 1 | 1 |
| H | H | H | 0 | 0 |

Suppose that, in the embodiment, the signal line LM and three information lines L1~L3 are initially charged to VDD. When reading the memory cell, the voltage on the signal line LM is programmed to a predetermined level, such as a level of the ground voltage GND, and the transistor is turned on by activating the word line connected to the control electrode of the transistor so as to charge the information line connected to the second electrode of the transistor. As the example shown in Table 2, when the information line L1 is connected to the second electrode T1-2 of the transistor T1 via the corresponding contact, the state of the information line L1 becomes low (L) when the voltage on the signal line LM is programmed to GND and the transistor T1 is turned on by activating the word line WL, and the state of the remaining information lines not connecting to the second electrode T1-2 of the transistor Ti remain high (H). Note that when none of the information lines L1~L3 is connected to the second electrode T1-2 of the transistor T1, the states of all the information lines L1~L3 remain high (H).

Figure 2:
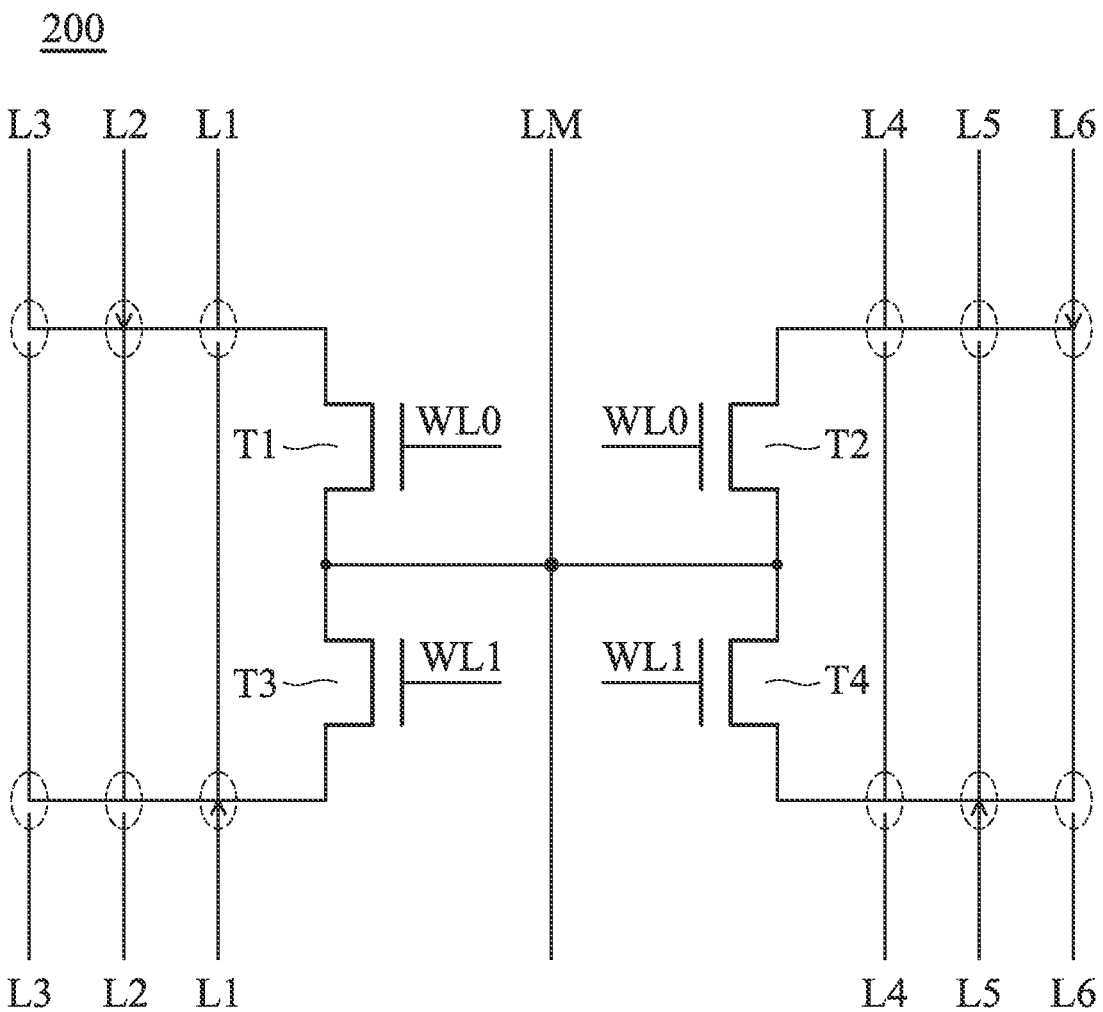
FIG. 2 shows an exemplary circuit diagram of four adjacent memory cells in a memory circuit according to an embodiment of the invention.

FIG. 2 shows an exemplary circuit diagram of four adjacent memory cells in a memory circuit according to an embodiment of the invention. According to an embodiment of the invention, the memory circuit 200 may at least comprise transistors T1~T4, a signal line LM, a first set of information lines L1~L3 and a second set of information lines L4~L6. Each transistor is comprised in a memory cell and comprises a first electrode, a second electrode and a control electrode. According to an embodiment of the invention, the control electrode may be the gate electrode, the first electrode may be the drain or source electrode and the second electrode may be the source or drain electrode. Note that in order to clarify the concept of the invention, FIG. 2 presents a simplified block diagram, in which only some elements relevant to the invention are shown. As will be readily appreciated by those with ordinary skill in the art, the memory circuit 200 may further be extended to comprise more than four memory cells, more than four transistors, more than two sets of information lines, more than three information lines in a set of information lines and/or more than one signal line, and thus, the invention should not be limited thereto.

As shown in FIG. 2, the word line WL0 is connected to the control electrode of the transistors T1 and T2, and the word line WL1 is connected to the control electrode of the transistors T3 and T4. The signal line LM is connected to the first electrodes of the transistors T1~T4. According to an embodiment of the invention, a voltage on the signal line LM is programmable. Therefore, the voltage on the signal line LM is not fixed. In addition, according to an embodiment of the invention, none or at most one the information line in the first set of information lines L1~L3 is connected to the second electrode of the transistor T1 via a corresponding contact, and none or at most one the information line in the first set of information lines L1~L3 is connected to the second electrode of the transistor T3 via a corresponding contact. In addition, according to an embodiment of the invention, none or at most one the information line in the second set of information lines L4~L6 is connected to the second electrode of the transistor T2 via a corresponding contact, and none or at most one the information line in the second set of information lines L4~L6 is connected to the second electrode of the transistor T4 via a corresponding contact.

In the embodiments of the invention, which information line is connected to the second electrode of a corresponding transistor can be flexibly designed depending on which information is to be stored in the corresponding memory cell. As the example shown in FIG. 2, the information line L2 is connected to the second electrode of the transistor T1, the information line L6 is connected to the second electrode of the transistor T2, the information line L1 is connected to the second electrode of the transistor T3 and the information line L5 is connected to the second electrode of the transistor T4.

Figure 4:
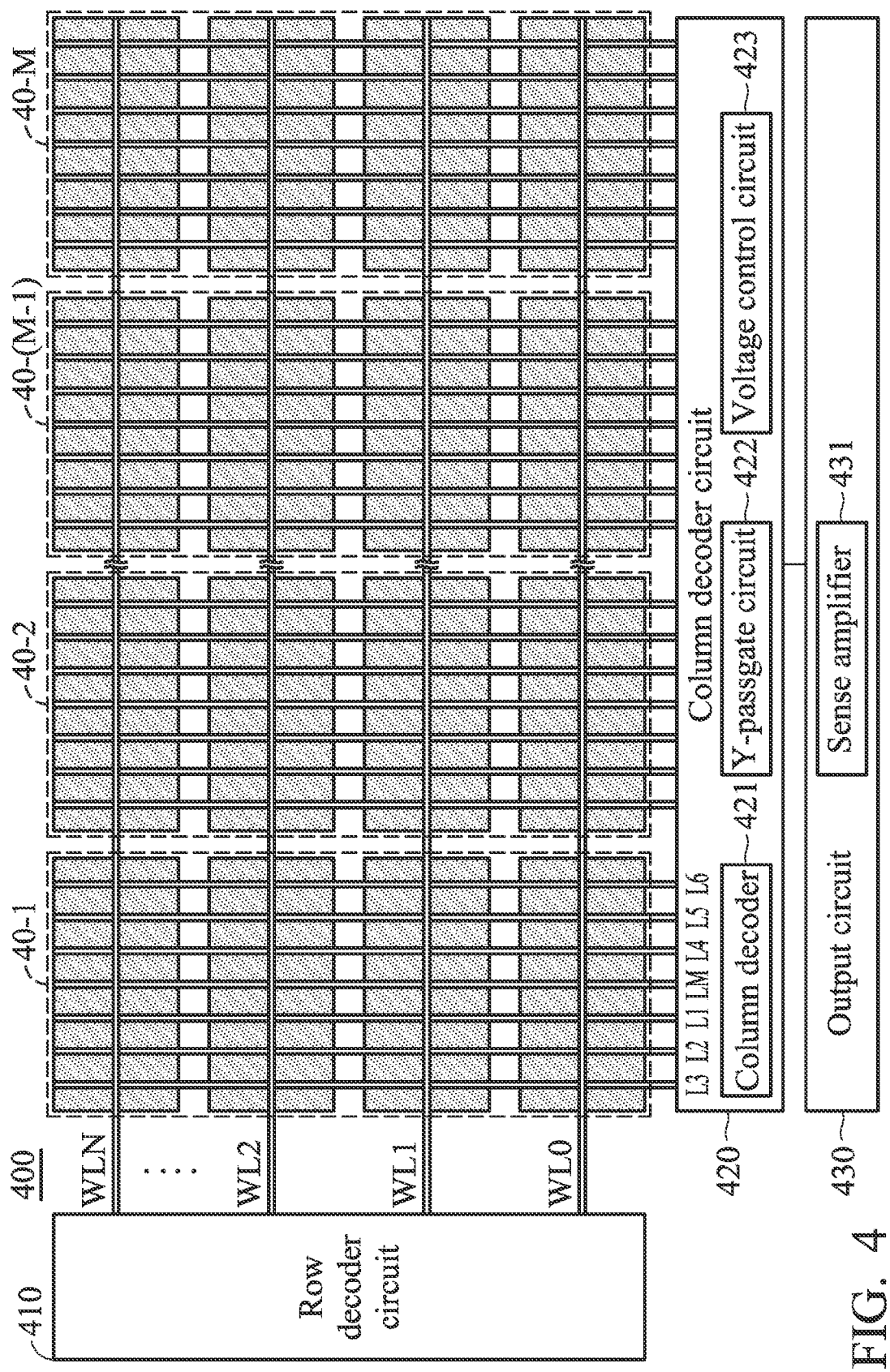
FIG. 4 shows an exemplary block diagram of a memory circuit according to an embodiment of the invention.

According to an embodiment of the invention, the signal line LM is a common controlled signal line and can be shared by adjacent transistors as shown in FIG. 4. In addition, in some embodiments of the invention, when the control electrode of each transistor is connected to a different word line, and when there are three information lines configured in a set of information lines for encoding multiple bits of information in each memory cell, two bits of information are output in a read operation as illustrated in the embodiment above.

However, when the control electrodes of each two transistors are connected to the same word line as the embodiment shown in FIG. 2 and when there are three information lines configured in a set of information lines for encoding multiple bits of information in each memory cell, four bits of information can be output in a read operation (which will be illustrated further in the following paragraph).

As will be readily appreciated by those ordinary skill in the art based on the concept as discussed above, the memory circuit may be designed to have more than two transistors connected to the same word line, or more than three information lines configured in a set of information lines, so as to output more bits of information in a read operation. Therefore, while the invention has been described by way of example and in terms of some embodiments, it should be understood that the invention is not limited thereto.

According to an embodiment of the invention, information stored in each memory cell is coded according to the voltage programmed on the signal line LM and an option of which information line the corresponding contact should connect to the second electrode of the corresponding transistor. In this manner, multiple bits of information, for example, two bits, four bits, or more bits, as discussed above, can be coded in the memory cell.

In an embodiment of the invention, the voltage programmed on the signal line LM is controlled and provided by a voltage control circuit (such as the voltage control circuit 423 shown in FIG. 4). In addition, the memory circuit may further comprise a sense amplifier (such as the sense amplifier 431 shown in FIG. 4) coupled to the information lines and sensing voltages on the information lines to output multiple bits of information. Take the circuit diagram shown in FIG. 2 as an example, when there are three information lines configured in a set of information lines for encoding multiple bits of information in each memory cell, the sense amplifier can output four bits of information in a read operation, such as the output bits Q[0]~Q[3] shown in the following tables, according to the sensed voltages.

Table 3a shows the exemplary output bits Q[0]~Q[1] coded by different states of three information lines L1~L3 and table 3b shows the exemplary output bits Q[2]~Q[3] coded by different states of three information lines L4~L6 according to an embodiment of the invention.

TABLE 3a exemplary output bits coded by different states of three information lines L1~L3

| States of information lines L1~L3 | | | Output Bits | |
|---|---|---|---|---|
| L1 | L2 | L3 | Q[1] | Q[0] |
| Coded | Empty | Empty | 0 | 1 |
| Empty | Coded | Empty | 1 | 0 |
| Empty | Empty | Coded | 1 | 1 |
| Empty | Empty | Empty | 0 | 0 |

TABLE 3b exemplary output bits coded by different states of three information lines L1~L3

| States of information lines L4~L6 | | | Output Bits | |
|---|---|---|---|---|
| L4 | L5 | L6 | Q[3] | Q[2] |
| Coded | Empty | Empty | 0 | 1 |
| Empty | Coded | Empty | 1 | 0 |
| Empty | Empty | Coded | 1 | 1 |
| Empty | Empty | Empty | 0 | 0 |

Here, the term "Coded" means that the information line is connected to the second electrode of the corresponding transistor via the corresponding contact, and the term "Empty" means that the information line is not connected to the second electrode of the corresponding transistor. When an information line is coded, the state (that is, voltage) of that information line varies with the voltage programmed on the signal line LM in a read operation. When an information line is empty, the state (that is, voltage) of that information line does not vary with the voltage programmed on the signal line LM and remains in its initial state in a read operation. In this manner, the sense amplifier can output bits Q[1:0] according to the voltages sensed on the information lines L1~L3 and output bits Q[3:2] according to the voltages sensed on the information lines L4~L6.

Take the embodiment shown in FIG. 2 as an example: when the information line L2 is coded and connected to the second electrode of the transistor T1 and the information line L6 is coded and connected to the second electrode of the transistor T2, in a read operation of the memory cells on word line WL0, the word line WL0 is activated so as to turn on the transistors T1 and T2 and the voltage on the signal line LM is charged to VDD. Therefore, the information lines L2 and L6 are charged according to the voltage on the signal line LM. Thereby, the states of the information lines L2 and L6 become high (H) and the states of the remaining information lines which are empty and not coded remain in their initial state, such as low (L). The sense amplifier coupled to the information lines L1~L6 senses the voltages on the information lines to output the corresponding bits as shown in Table 3a and Table 3b.

Figure 3:
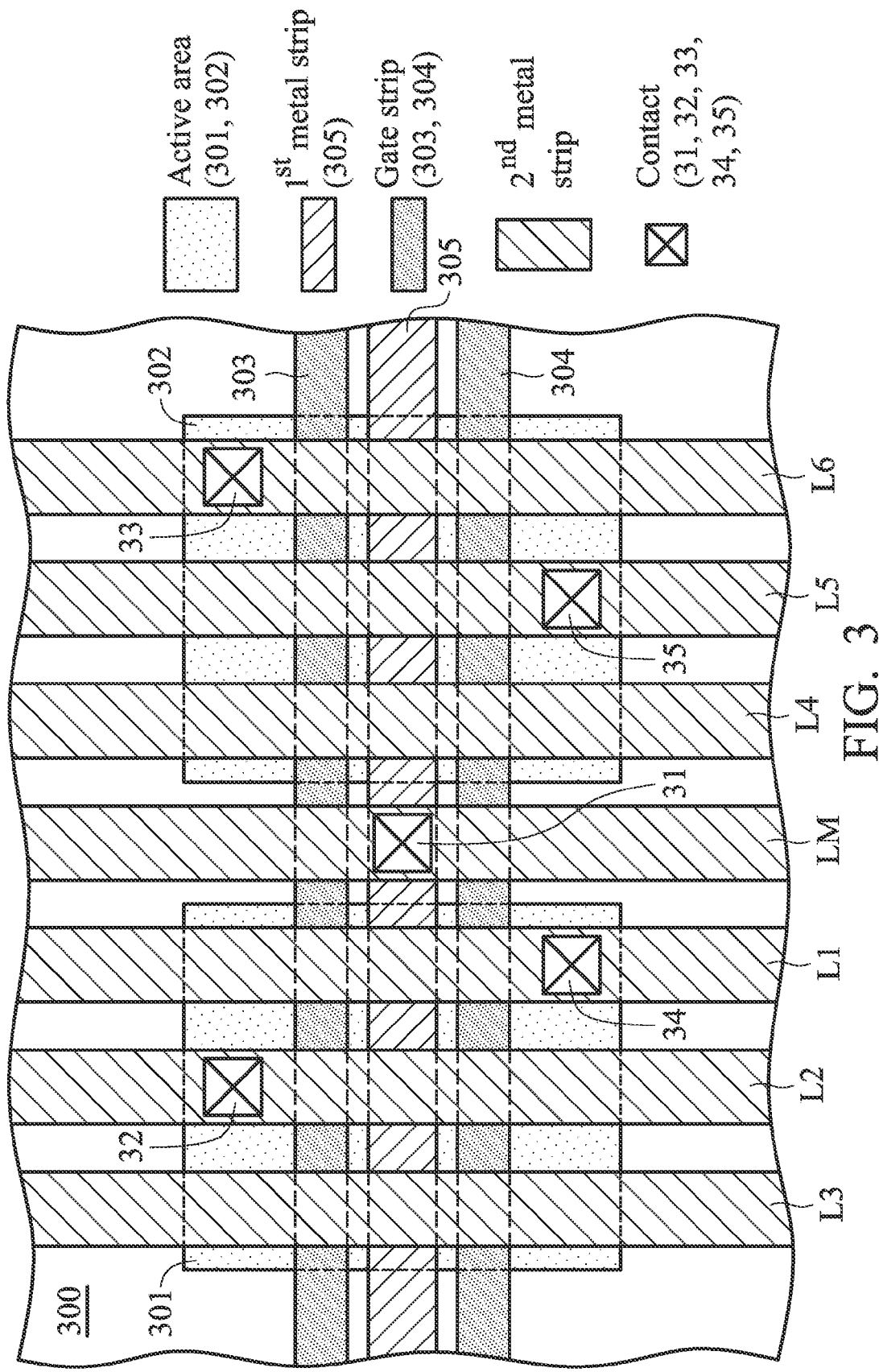
FIG. 3 shows an exemplary layout structure of a memory circuit according to an embodiment of the invention.

FIG. 3 shows an exemplary layout structure of a memory circuit according to an embodiment of the invention. At least one active area is disposed on the substrate 300, such as the active areas 301 and 302 as shown. At least one gate strip is disposed on the active area and extended along a first direction, such as the gate strips 303 and 304 as shown. At least one first metal strip is disposed on the active area and extended along the first direction, such as the first metal strip 305. A plurality of second metal strips are extended along a second direction and comprise at least a first second metal strip forming the signal line LM of the memory circuit and a plurality of second and third metal strips forming different sets of information lines of the memory circuit, such as the first set of information lines L1~L3 and the second set of information lines L4~L6. Note that in order to clarify the concept of the invention, in the embodiment of the invention, the layout structure shown in FIG. 3 corresponds to the circuit diagram of the memory circuit shown in FIG. 2.

According to an embodiment of the invention, the gate strip 303 is disposed on the active area 301 to form the transistor T1, and it is disposed on the active area 302 to form the transistor T2. The gate strip 304 is disposed on the active area 301 to form the transistor T3 and disposed on the active area 302 to form the transistor T4. In addition, the signal line LM and at most one information line in the corresponding set of information lines is connected to different electrodes of the corresponding transistor via different contacts, such as the contacts 31~35 shown in FIG. 3, to form a multi-bit information coded memory cell as discussed above.

According to an embodiment of the invention, the first metal strip is formed by a first metal layer Ml, the plurality of second metal strips are formed by a second metal layer M2. The second metal layer M2 is disposed above the first metal layer Ml. The contact 31 connects the second metal strip which forms the signal line LM and the first metal strip 305. The first metal strip 305 is disposed between the active areas 301 and 302 and the second metal layer M2, such that the signal line LM is connected to the first electrode of the corresponding transistors via the contact 31. In addition, according to an embodiment of the invention, the first metal layer Ml is disposed above a layer where the gate strip(s) are formed.

Therefore, in one embodiment of the invention, from a cross-section view of the exemplary layout structure of a memory circuit as shown in FIG. 3, the layers disposed on the substrate 300 to form the corresponding elements should be, from the bottom to the top, the layer forming the active areas 301 and 302, the layer forming the gate strips 303 and 304, the first metal layer Ml forming the first metal strip 305 and the second metal layer M2 forming the second metal strips. In addition, according to an embodiment of the invention, the first direction is orthogonal to the second direction.

FIG. 4 shows an exemplary block diagram of a memory circuit according to an embodiment of the invention. The memory circuit 400 may comprise a row decoder circuit 410, a column decoder circuit 420, an output circuit 430 and a plurality of memory cell arrays 40-1~40-M. The row decoder circuit 410 is coupled to the plurality of memory cell arrays 40-1~40-M through a plurality of word lines WL0~WLN and determines which word line to activate according to the decoded result.

The column decoder circuit 420 may comprise at least a column decoder 421, a Y-passgate circuit 422 and a voltage control circuit 423. The column decoder 421 is coupled to the plurality of memory cell arrays 40-1~40-M and selects a group of memory cells to be decoded. The Y-passgate circuit 422 is coupled to the information lines, such as the information lines L1~L6 as shown, and passes the voltages on the information lines to the sense amplifier 431 in the output circuit 430. Note that in each read operation, the Y-passgate circuit 422 only passes the voltages on the information lines coupled to the group of memory cells selected by the column decoder 421 to the sense amplifier 431. The voltage control circuit 423 controls the voltage programmed on the signal line LM.

The output circuit 430 may comprise at least the sense amplifier 431. The sense amplifier 431 may be coupled to the information lines and shared by all the memory cells to sense voltages on the information lines. Note that in order to clarify the concept of the invention, FIG. 4 presents a simplified block diagram, in which only the elements relevant to the invention are shown. However, the invention should not be limited what is shown in FIG. 4.

Figure 5:
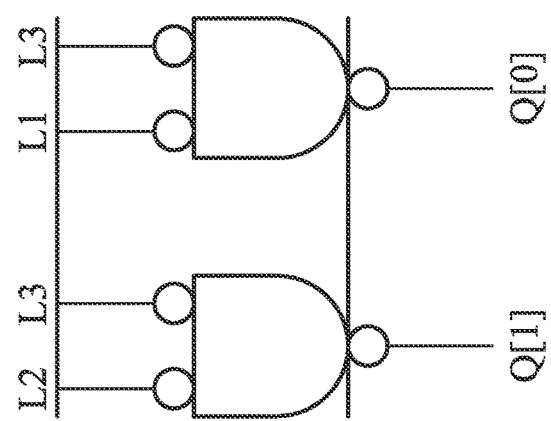
FIG. 5 shows an exemplary circuit diagram of a sense amplifier according to an embodiment of the invention.

FIG. 5 shows an exemplary circuit diagram of a sense amplifier according to an embodiment of the invention. As shown in FIG. 5, the sense amplifier 531 may comprise two AND gates to perform logic operations on the voltages on the information lines L1~L3, so as to output the corresponding bits Q[0] and Q[1]. Note that in order to clarify the concept of the invention, FIG. 5 presents one exemplary circuit diagram of a sense amplifier. It should be noted that there are still a variety of possible circuit designs comprising different types and/or numbers of logic gates and/or circuits for implementing a sense amplifier. Therefore, the invention should not be limited what is shown in FIG. 5.

Figure 6:
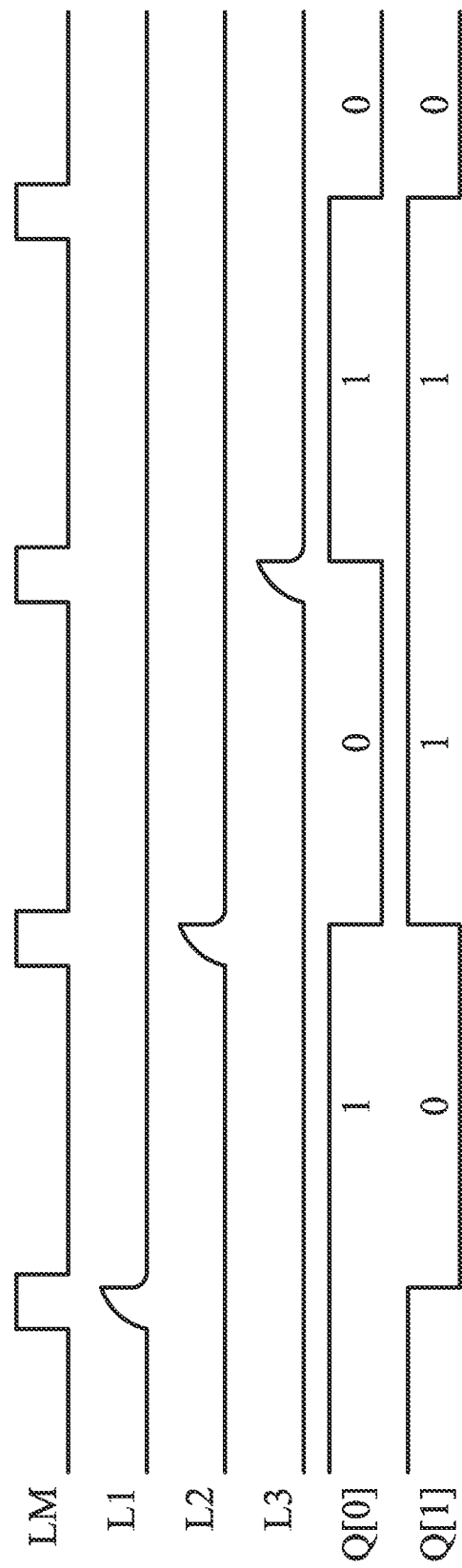
FIG. 6 is a diagram showing the exemplary waveforms of the voltages on the signal line, information lines and the corresponding output bits in several read operations according to an embodiment of the invention.

FIG. 6 is a diagram showing the exemplary waveforms of the voltages on the signal line, information lines and the corresponding output bits in several read operations according to an embodiment of the invention. Generally, a read operation can be triggered in one clock cycle. As shown in FIG. 6, when different information lines are coded in the memory cells, different combinations of the bits Q[0] and Q[1] can be output in the read operations. Therefore, in the embodiments of the invention, information to be stored in the memory cell is embedded via the options of which information line the contact should connect to the transistor, and multiple bits of information can be generated by one transistor. In addition, in the embodiments of the invention, the number of output bits can be flexibly designed and easily extended from two to four, or even more as illustrated. Therefore, compared to the conventional designs, in which only one bit of information can be generated by one transistor, the proposed memory architectures allow multi-bit information coded memory for high density ROM to be achieved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A memory circuit, comprising:
   a transistor, comprising a first electrode, a second electrode and a control electrode, wherein the transistor is comprised in a memory cell;
   a signal line, connected to the first electrode of the transistor, wherein a voltage on the signal line is programmable; and
   a plurality of information lines, wherein at most one of the information lines is connected to the second electrode of the transistor via a contact,
   wherein information stored in the memory cell is coded according to the voltage programmed on the signal line and an option of which information line the contact should connect to the second electrode of the transistor.

2. The memory circuit as claimed in claim 1, wherein multiple bits of information are coded in the memory cell.

3. The memory circuit as claimed in claim 1, wherein in a read operation of the memory cell, the voltage on the signal line is programmed to a predetermined level and the transistor is turned on by activating a word line connected to the control electrode of the transistor, so as to charge the at most one of the information lines connected to the second electrode of the transistor.

4. The memory circuit as claimed in claim 3, further comprising a sense amplifier coupled to the information lines and sensing voltages on the information lines.

5. The memory circuit as claimed in claim 4, wherein at least two bits of information are outputted by the sense amplifier according to the sensed voltages.

6. A memory circuit, comprising:
   a plurality of transistors, comprising at least a first transistor and a second transistor, wherein each transistor is comprised in a memory cell and comprises a first electrode, a second electrode and a control electrode;
   a signal line, connected to the first electrode of the first transistor and the first electrode of the second transistor, wherein a voltage on the signal line is programmable;
   a first set of information lines, wherein at most one information line in the first set of information lines is connected to the second electrode of the first transistor via a first contact; and
   a second set of information lines, wherein at most one information line in the second set of information lines is connected to the second electrode of the second transistor via a second contact,
   wherein information stored in each memory cell is coded according to the voltage programmed on the signal line and an option of which information line in the corresponding set of information lines the corresponding contact should connect to the second electrode of the corresponding transistor.

7. The memory circuit as claimed in claim 6, wherein multiple bits of information are coded in each memory cell.

8. The memory circuit as claimed in claim 6, wherein in a read operation of a memory cell, the voltage on the signal line is programmed to a predetermined level and the corresponding transistor in the memory cell is turned on by activating a word line connected to the control electrode of the corresponding transistor, so as to charge the at most one information line in the corresponding set of information lines connected to the second electrode of the corresponding transistor.

9. The memory circuit as claimed in claim 8, further comprising a sense amplifier coupled to the first set of information lines and the second set of information lines and sensing voltages on the first set of information lines and the second set of information lines.

10. The memory circuit as claimed in claim 9, wherein at least two bits of information is outputted by the sense amplifier according to the sensed voltages.

11. The memory circuit as claimed in claim 6, wherein each of the first set of information lines and the second set of information lines comprise three information lines, and two bits of information are output in a read operation.

12. The memory circuit as claimed in claim 6, wherein the plurality of transistors further comprises a third transistor and a fourth transistor, wherein the signal line is further connected to the first electrode of the third transistor and the first electrode of the fourth transistor, at most one information line in the first set of information lines is connected to the second electrode of the third transistor via a third contact and at most one information line in the second set of information lines is connected to the second electrode of the fourth transistor via a fourth contact.

13. The memory circuit as claimed in claim 12, further comprising a first word line connecting to the control electrode of the first transistor and the control electrode of the second transistor and a second word line connecting to the control electrode of the third transistor and the control electrode of the fourth transistor.

14. The memory circuit as claimed in claim 13, wherein in a read operation of the memory cells on a corresponding word line, the voltage on the signal line is programmed to a predetermined level and the corresponding transistors connected to the corresponding word line are turned on by activating the corresponding word line, so as to charge the at most one information line in the first set of information lines and the at most one information line in the second set of information lines connected to the second electrode of the corresponding transistors connected to the corresponding word line.

15. The memory circuit as claimed in claim 13, wherein both the first set of information lines and the second set of information lines comprise three information lines, and four bits of information are output in a read operation.

* * * * *